United States Patent
Engel et al.

(10) Patent No.: US 8,762,076 B2
(45) Date of Patent: Jun. 24, 2014

(54) SYSTEM AND METHOD FOR SELECTIVE DISTRIBUTION OF MEASUREMENT DEVICE CONFIGURATION IN A LOOSELY COUPLED AUTONOMOUS SYSTEM

(75) Inventors: Glenn R. Engel, Snohomish, WA (US); Glen L. Purdy, Jr., Snohomish, WA (US); Jerry J. Liu, Sunnyvale, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 2290 days.

(21) Appl. No.: 11/230,895

(22) Filed: Sep. 20, 2005

(65) Prior Publication Data
US 2007/0067113 A1 Mar. 22, 2007

(51) Int. Cl.
*G01B 3/00* (2006.01)
*G01R 31/28* (2006.01)
*G06F 11/00* (2006.01)
*G01R 31/302* (2006.01)

(52) U.S. Cl.
CPC ........ *G01R 31/2886* (2013.01); *G01R 31/3025* (2013.01)
USPC .............. 702/33; 702/188; 702/189; 702/190

(58) Field of Classification Search
USPC ........... 702/33, 127, 121–123, 180, 188–190; 324/757; 340/3.1
See application file for complete search history.

(56) References Cited

U.S. PATENT DOCUMENTS

| | | | |
|---|---|---|---|
| 6,072,396 A | 6/2000 | Gaukel | |
| 6,225,901 B1 | 5/2001 | Kail, IV | |
| 6,437,692 B1 | 8/2002 | Petite et al. | |
| 6,762,684 B1 | 7/2004 | Camhi | |
| 2003/0134631 A1* | 7/2003 | Snyder et al. | 455/423 |
| 2004/0066271 A1* | 4/2004 | Leck | 340/3.1 |
| 2004/0196182 A1 | 10/2004 | Unnold | |
| 2004/0203437 A1* | 10/2004 | Burch et al. | 455/67.11 |
| 2006/0019679 A1* | 1/2006 | Rappaport et al. | 455/456.5 |

OTHER PUBLICATIONS

GB Search Report Under Section 17 dated Nov. 16, 2006.

* cited by examiner

*Primary Examiner* — Phuong Huynh
(74) *Attorney, Agent, or Firm* — Volentine & Whitt, PLLC

(57) ABSTRACT

Probe configuration is achieved in a measurement system in which probes are given possible configuration data depending upon conditions in an area relevant to the area of the probe. The possible probe configurations include global boundaries, such as time, and each probe then, based upon the possible configurations, selects a configuration. In one embodiment, the probe may interact with a central processor to further define the probe configuration. In one embodiment, probes may communicate with other probes, both to help define their operating environment and to optionally provide configuration data to another probe.

18 Claims, 2 Drawing Sheets

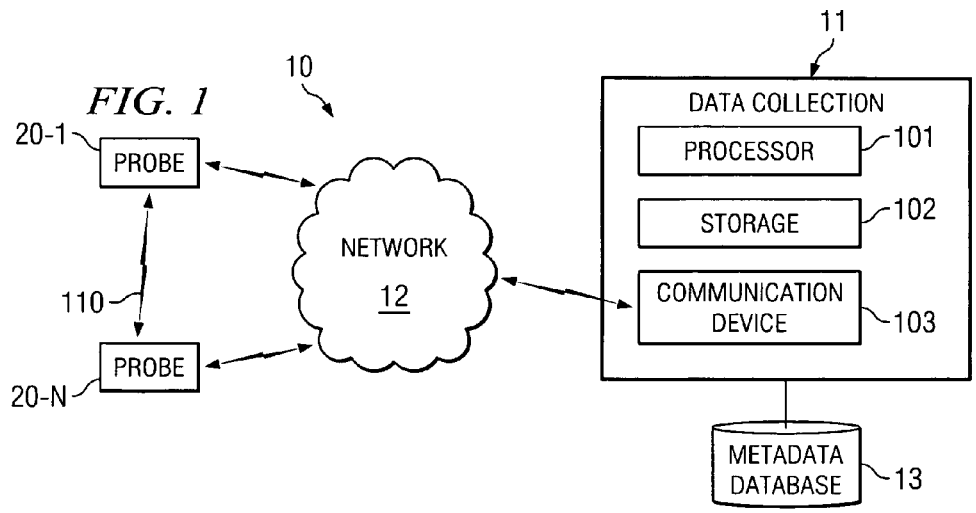
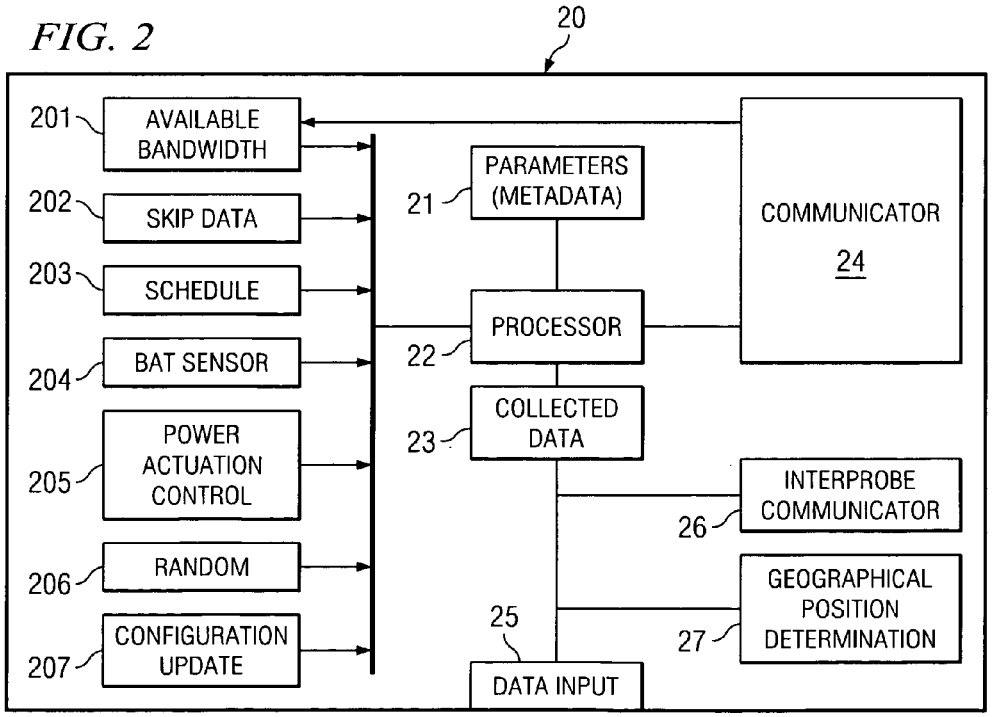

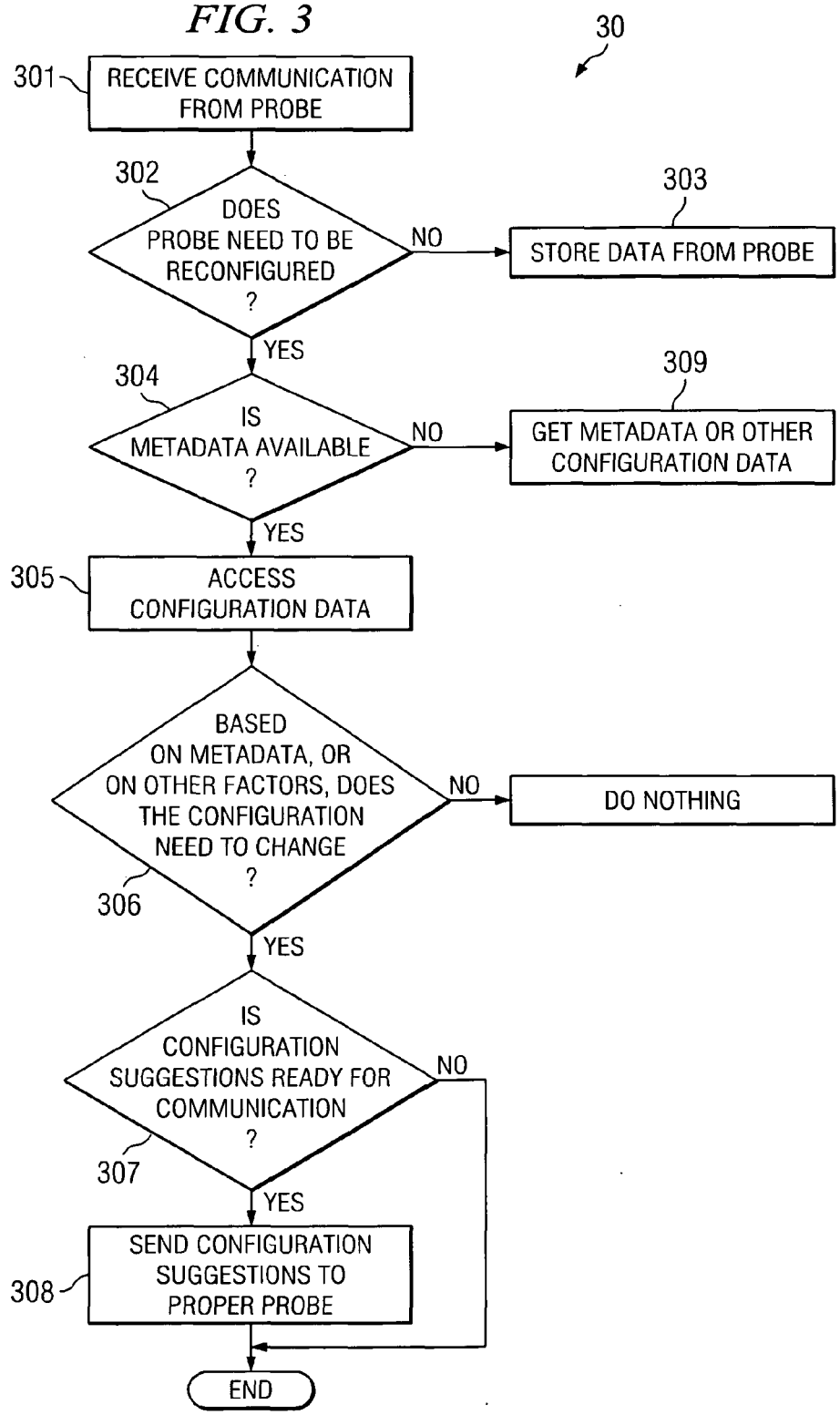

SYSTEM AND METHOD FOR SELECTIVE DISTRIBUTION OF MEASUREMENT DEVICE CONFIGURATION IN A LOOSELY COUPLED AUTONOMOUS SYSTEM

CROSS-REFERENCE TO RELATED APPLICATIONS

This application is related to concurrently filed and commonly assigned U.S. patent application Ser. No. 11/230,878 entitled "SYSTEM AND METHOD FOR OPPORTUNISTIC TRANSMISSION OF TEST PROBE METADATA"; and concurrently filed and commonly assigned U.S. patent application Ser. No. 11/230,774 entitled "SYSTEM AND METHOD FOR TEST PROBE MANAGEMENT", the disclosures of which are hereby incorporated herein by reference.

TECHNICAL FIELD

This invention relates to measurement device configuration and more particularly to systems and methods for selective distribution of measurement device configuration.

BACKGROUND OF THE INVENTION

It is customary for measurement systems to use a number of individual measurement devices (probes) to obtain data at particular locations within the system being monitored. It is also customary for the measurement system to keep track of each probe by knowing, for example, its identity, its type, what units it measure in, etc. This information pertaining to each probe (called metadata) is stored in a measurement system database for interpretation of data from the various probes and for probe configuration purposes.

In a system with thousands (or millions) of probes, distribution of configuration information to the devices can be burdensome on both the server and the probes. As an example, consider a system that has twenty thousand different configurations based on such criteria as: time, location, or another measured quantity. It would be burdensome to communicate the entire set of configuration data to every probe, both in terms of network bandwidth as well as probe resources. However, the probes need to know what their current configuration should be at any given moment and asking a configuration server for advice frequently would increase the communication requirements significantly.

BRIEF SUMMARY OF THE INVENTION

Probe configuration is achieved in a measurement system in which probes are given possible configuration data depending upon conditions in an area relevant to the area of the probe. The possible probe configurations include global boundaries, such as time, and each probe then, based upon the possible configurations, selects a configuration. In one embodiment, the probe may interact with a central processor to further define the probe configuration. In one embodiment, probes may communicate with other probes, both to help define their operating environment and to optionally provide configuration data to another probe.

BRIEF DESCRIPTION OF THE DRAWINGS

FIG. 1 illustrates one embodiment of a multi-probe measurement system;

FIG. 2 shows one embodiment of a probe having various controls for sending metadata; and FIG. 3 shows one embodiment of a probe configuration arrangement for a measurement system.

DETAILED DESCRIPTION OF THE INVENTION

FIG. 1 illustrates one embodiment 10 of a test measurement system having a plurality of spaced apart probes. The concepts taught herein can be used in such a system or can be used with any system in which a data collection point has metadata (or parameter data) for each probe. In the discussion to follow, a test system will be described where the metadata is communicated from the various probes, such as from probes 20-1 to 20-N, to the data collection point. In this example, sensor 20-1 is a sensor that is producing, for example, temperature readings and is designed to report its metadata (if metadata is required) on demand of a test system. The sensor could, if desired, be designed to occasionally transmit part, or all, of its metadata by omitting a regular scheduled temperature reading or it could randomly insert the metadata transmission (e.g., once an hour, once a day, etc.), or it could wait for its battery level to be high, or it could use other opportunistic criteria useful to its situation.

In the embodiment of FIG. 1, the data from probe 20-1 is transmitted to data collection 11 via network 12 either wirelessly or by wireline or by a combination thereof. Also note that a network need not be used, but rather some or all of the communications from probes 20-1 to 20-14 can be point-to-point using one or more wireless protocols, such as, for example, the Bluetooth protocol.

FIG. 2 shows one embodiment 20 of a probe having various controls for sending metadata. In the embodiment, metadata contained in storage 21 and data from the probe (for example data obtained via input 25), is stored in storage 23. Note that storages 21 and 23 can be the same storage if desired. Also note that the measured data sent from probe 20 need not be stored and can be sent directly from input 25 as collected. Input 25 can measure data, or sense data, or sense conditions and report the results of the "sensing". In addition, data can be provided to input 25 from other sensors. In the discussion herein, measured data sent from probe 20 includes any mode or manner of collecting and sending such data. In the embodiment, data is sent under control of processor 22 and communicator 24.

Control units 201-206 allow various opportunistic metadata transfers, as discussed in the above-identified patent application entitled "SYSTEM AND METHOD FOR TEST PROBE MANAGEMENT", with each such metadata transfer usually being less than all of the metadata necessary for a data collected in a device, such as device 11 FIG. 1, to fully utilize the data sent from the probe. Also note that not all probes require all controls 201-206 and probes may have other controls or timers or sensors, such as geographical position determination 27 for controlling other opportunistic events. In many situations, such opportunistic data transfers are not required and metadata can be sent all at one time if such metadata is required.

FIG. 3 shows one embodiment 30 of a probe configuration arrangement for a measurement system. Process 301 receives data from a probe and process 302 determines if this is a probe that must be reconfigured (such as a new probe, or a probe whose configuration must be changed for some reason). If the probe does not have to be configured, then process 303 stores the data from the probe in the customary manner.

If the probe must be configured or reconfigured, process 304 determines if enough configuration information (such as, for example, metadata) is available. If not, the metadata data must be gathered via process 309.

Process 305 accesses the existing metadata (or other configuration data) to determine probe configuration. Process 306 determines, based on metadata (or other information that allows for a proper determination of probe configuration) if a probe (or set of probes) should change configuration. If a new configuration is required, then process 307 gathers a set of "suggestions" as to the new configuration and process 308 sends the new configuration suggestions to the probe (or probes). This communication can be over one or more links, such as, for example, network 12, FIG. 1. The communication can be point to point, using any desired communication medium, including wireline or wireless and using any one or more communication protocols. Note that communication to and from any probe need not be the same as communication to any other probe. Also note that the configuration data can be a software module for running within the probe. This software module then, when activated, would at least partially control the operation of the probe.

The "suggestions" used by process 307 give some minimal configuration hints to the server (for example, data collection 11, FIG. 1) so the server can provide the probe with a relevant subset of the global configuration. In addition, the configuration given to the probe can have bounds (time and location) which allows the probe to decide on its own when it is time to refresh its configuration from the suggestions provided. The suggestions can be stored in data storage, such as storage 21 or 23 or in a separate storage (not shown) and is controlled, for example, by configuration update 207, FIG. 2, working in conjunction with processor 22.

One example of operation would be for a probe to contact data collection 11 (FIG. 1) and provide its current location and capabilities. The data collection (server) would examine its database (as discussed above) and select a relevant configuration based on an area around the current probe location and time. For example, configurations within a 20 km bounding box could be considered relevant for one device, while for another device it might be configurations within a 300 meter bounding box.

By applying a bounding box to the list of potential configurations (suggestions), only the configurations that are currently relevant, or possibly soon to be relevant, are communicated to the probe. Additionally the configurations themselves are provided with a global bounding specification (such as time) that determines when a probe should decide to refresh its configuration list. It is also possible for the probes to provide hints (via metadata or other communications) to the server about what type of boundaries it prefers or is capable of processing. The probe consumes the configurations and chooses which are to be active (zero or more).

The probe for example, under control of processor 22 and configuration update 207, monitors the bounding box for the set of configurations and contacts the server for an update when the boundary is exceeded. For example, in one embodiment, the bounding box for configuration refresh could be 75% of the area covered by the configurations provided to the probe. Thus, a probe might be given suggested configurations valid within a 20 km area but be told to refresh (or obtain new "suggestions") when the probe moves outside of a 15 km area. This allows the probe to remain active as it approaches a boundary while providing time to obtain new configurations.

A configuration boundary could, for example, contain the following fields: location bounding box specified as two corners; start and stop time; and participation percentage.

Participation percentage specifies the odds that the probe will select this particular configuration. For example, if the participation percentage were 10% then an individual probe would only decide to use the configuration 10% of the time. This allows the system to cut back on excess data (without directing individual probes to change behavior) when there are a large number of probes that may be able to make the same measurement.

Additional configuration specifications could include aspects such as: battery level, signal strength, velocity, time, (such as minute, hour, day, year, etc.) or any number of other criteria. For example, a probe could be directed to only collect data when its velocity (or the velocity it is measuring) is moving greater than 30 mph, perhaps as determined by geographical position determination 27.

This system has several advantages. For example, only configurations that are relevant to a particular probe need be communicated to the probe. The probe itself can manage the transition from one configuration to another and the server only needs to be consulted when the probe decides that it's configuration is close to expiring. This procedure reduces communication bandwidth and allows probes to be managed 'in aggregate' rather than individually (e.g. participation percentage).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A probe for use in a measurement system; said probe comprising:
    memory for storing data pertaining to possible configurations for said probe;
    a processor for selecting one of said possible probe configurations; and:
    a location determination device; and wherein said possible probe configurations comprise:
    location parameters for use by said processor to select a configuration from said possible configurations at least partially based on a determined location of said probe as suggested by a measurement system controller.

2. The probe of claim 1 wherein said processor is further operable to change said probe configuration from time to time depending upon a determined location of said probe.

3. The probe of claim 1 wherein said processor selection of probe configuration is dependant upon factors unique to said probe.

4. The probe of claim 3 wherein said unique factors include one or more of: number of other probes in a defined area; configurations of probes in a defined area; a probability table built into said probe for each possible selection; number of measurements made of a certain type by said probe; participation percentage; measurement values; connectivity status; and time.

5. The probe of claim 1 further comprising:
a communication device for communicating parameters pertaining to said probe to a data gathering point.

6. The probe of claim 5 wherein said possible probe configurations are communicated to said probe from said data gathering point.

7. The probe of claim 6 wherein said possible configurations are dependant upon said probe parameters communicated from said probe.

8. The probe of claim 1 wherein said possible probe configurations are communicated to said probe from a data gathering point.

9. The probe of claim 1 wherein said possible probe configuration data is at least one runnable software module.

10. A probe for use in a measurement system; said probe comprising:
memory for storing data pertaining possible configurations for said probe;
a processor for selecting one of said possible configurations, wherein said possible probe configurations are communicated to said probe, at least in part, from another probe.

11. A method comprising:
in a measurement system, providing spaced-apart probes;
receiving configuration data at said probes, wherein said configuration data for each probe is a list of possible configurations for said probe; and
selecting, under control of each said probe, from said list of possible configurations, a configuration for use by said probe,
wherein said configuration data is communicated to said probes at least in part from another of said probes.

12. The method of claim 11 further comprising:
communicating measurements in accordance with said configuration data.

13. The method of claim 12 wherein said measurements are communicated to said measurement system.

14. The method of claim 11 further comprising:
communicating metadata to said measurement system from said probes.

15. The method of claim 11 wherein said configuration data is communicated to said probes at least in part from said measurement system.

16. The method of claim 11 wherein said processor is further operable to change said probe configuration from time to time depending upon a determined location of said probe.

17. The method of claim 11 wherein said selection of probe configuration is dependant upon factors unique to said probe.

18. The method of claim 17 wherein said unique factors include one or more of:
numbers of other probes in a defined area;
configurations of probes in a defined area;
a probability table built into said probe for each possible selection;
number of measurements made of a certain type by said probe;
participation percentage;
measurement values;
connectivity status; and
time.

* * * * *

UNITED STATES PATENT AND TRADEMARK OFFICE
CERTIFICATE OF CORRECTION

PATENT NO. : 8,762,076 B2  
APPLICATION NO. : 11/230895  
DATED : June 24, 2014  
INVENTOR(S) : Engel et al.

Page 1 of 1

It is certified that error appears in the above-identified patent and that said Letters Patent is hereby corrected as shown below:

In the Claims

Claim 10, column 5, line 18, "data pertaining possible configurations" should read --data pertaining to possible configurations--

Claim 10, column 5, line 20, "one of said possible configurations," should read --one of said possible probe configurations,--

Signed and Sealed this
Seventh Day of April, 2015

Michelle K. Lee
*Director of the United States Patent and Trademark Office*